(12) United States Patent
Wang et al.

(10) Patent No.: US 7,296,345 B1
(45) Date of Patent: Nov. 20, 2007

(54) METHOD FOR MANUFACTURING A MEMORY DEVICE

(75) Inventors: Kuang-Yu Wang, Saratoga, CA (US); Jim Ni, San Jose, CA (US); Ren-Kang Chiou, Fremont, CA (US); Edward W. Lee, Mountain View, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 407 days.

(21) Appl. No.: 10/991,313

(22) Filed: Nov. 16, 2004

(51) Int. Cl.
*H05K 3/30* (2006.01)
*H01R 12/00* (2006.01)

(52) U.S. Cl. .............. 29/832; 29/840; 29/841; 29/855; 29/856; 29/860; 29/876; 29/883; 439/79

(58) Field of Classification Search .......... 29/832, 29/841, 848, 855, 856, 876, 883, 840, 860; 439/676, 638, 946, 737, 79; 361/737, 752, 361/736; 264/453, 425, 463, 443; 257/679, 257/79
See application file for complete search history.

(56) References Cited

U.S. PATENT DOCUMENTS

| | | | | |
|---|---|---|---|---|
| 5,797,771 A | * | 8/1998 | Garside | ............ 439/610 |
| 5,984,731 A | * | 11/1999 | Laity | ............ 439/676 |
| 6,132,243 A | * | 10/2000 | Hirata et al. | ........ 439/541.5 |
| 6,159,038 A | * | 12/2000 | Wu | ............ 439/541.5 |
| 6,279,955 B1 | * | 8/2001 | Fisher | ............ 280/837 |
| 6,618,243 B1 | | 9/2003 | Tirosh | |
| 2003/0100203 A1 | | 5/2003 | Yen | |

* cited by examiner

*Primary Examiner*—A. Dexter Tugbang
*Assistant Examiner*—Tai Van Nguyen
(74) *Attorney, Agent, or Firm*—Bever, Hoffman & Harms, LLP; Patrick T. Bever

(57) ABSTRACT

A portable memory device includes a molded housing and a printed circuit board assembly (PCBA) encased with the molded housing such that a plug connector extends from one end. A lower housing portion is produced by injection molding using a first apparatus, and then the lower housing portion is transferred to a second molding apparatus. The PCBA is mounted onto the lower housing such that the plug connector is received in a protected region. The second molding apparatus is then closed, and an upper housing portion is injected molded over the PBCA and exposed peripheral edges of the lower housing portion such that the upper housing portion becomes fused to the lower housing portion. Multiple lower housing portions connected together by plastic tethers to form a plastic strip, which facilitates efficient transfer to the second molding apparatus as a unit. The tethers are subsequently removed (e.g., singulated) to form individual memory devices.

19 Claims, 13 Drawing Sheets

METHOD FOR MANUFACTURING A MEMORY DEVICE

FIELD OF THE INVENTION

The present invention relates to computer peripheral devices and, in particular, it concerns a pocket-size computer peripheral devices that are connected with host computer systems by way of plug connectors such as USB plug connectors.

BACKGROUND OF THE INVENTION

In the field of computers and computer peripheral devices, there is an ongoing trend towards miniaturization for convenience and portability. In certain cases, memory devices have been reduced to "pocket size", meaning that they can literally be carried in a user's pocket in the same manner as a wallet or set of keys.

One family of memory devices that are of particular interest, and in which context the present invention will be described herein, are known as "USB memory devices", which may include USB flash disks or USB flash drives. For example, one product includes a pen-type flash memory device having a USB connector plug that can be connected to a USB port of a standard computer. In such devices, the USB plug connector is protected by a removable cover when not in use.

FIGS. 16 and 17 are exploded perspective and perspective views, respectively, showing a conventional pen-type USB flash drive device 50 including a housing 51 that encloses a printed circuit board assembly (PCBA) 70 including a printed circuit board (PCB) 73, one or more integrated circuit (IC) devices 74 mounted on PCB 73, and a plug connector 75 mounted on a front end of PCB 73. Housing 51 includes an upper housing portion 51-A and lower housing portion 51-B that are separately molded and then assembled using conventional methods such as ultrasonic joining and snap-couple connection. The joining process typically occurs at specific locations along the edges of the covers, and thus the joining is not continuous along the interface. A seam 54 is formed between upper housing portion 51-A and lower housing portion 51-B, and becomes the weakest point in the USB flash memory device due to mechanical movement at plug connector 75 during repeated inserting to and removing from an USB socket.

A problem with conventional pen-type peripheral devices that have a two-piece housing is that the two-piece housing must be assembled manually, which results in long production cycle time and high production costs. In addition, the two-piece housing may become partially separated, causing the plug connector to become loose and separated from the PCBA/housing. For example, seam 54 (FIG. 17) is prone to break at the joining locations due to repeated insertion of pen-type USB flash drive device 50 into and removal from a USB socket of a host system, thus separating the covers and resulting in failure.

What is needed is method for producing pen-type portable computer peripheral devices, such as USB memory devices, which overcomes the problems associated with conventional structures.

SUMMARY

The present invention is directed to a portable computer peripheral device including a molded housing, and a plug connector (e.g., a USB plug connector) extending from a front end of the molded housing. The present invention is particularly directed to a method for producing a memory device in which a lower housing portion is molded using a first molding apparatus, a printed circuit board assembly (PCBA) is mounted onto the lower housing portion such that a plug connector extends from a front end of the lower housing portion, and then the upper housing portion is molded onto exposed side edges of the lower housing portion and over the electrical components of the PCBA such that the upper housing portion becomes fused with the lower housing portion around the PCBA. By producing the molded housing in this manner, a portable memory device is provided in which the molded housing provides effective protection to the electronic components mounted on the PCBA, and also provides firm and secure support for the USB plug connector so the USB plug connector will not become loose and separated from the molded housing after extended usage. Further, the method reduces production costs by eliminating costly manual assembly work and additional joining processes, such as ultrasonic bonding or snap-coupling of two housing portions. Moreover, because molding process integrates upper and lower housing portions, the production method presented renders portable memory devices having an attractive appearance due to the elimination of a connection seam.

In accordance with an embodiment of the present invention, the method begins by manufacturing a PCBA and a plastic strip including several lower housing portions. The PCBA includes the plug connector, IC devices and other optional components mounted onto a PCB. The IC devices are operably connected to contact pins of the plug connector such that the IC devices are connected with a host system when the plug connector is plugged into a female socket of the host system. The plastic strip is formed in a first molding apparatus such that each adjacent pair of lower housing portions is linked by a plastic tether, which maintains a predetermined spacing between the lower housing portions. Each lower housing portion attached to the plastic strip includes a lower wall surrounded by peripheral edges (i.e., a front edge, a back edge, and side edges extending between the front and back edges). The plastic strip is then removed from the first molding apparatus and mounted onto the lower die of a second molding apparatus that has a cavity network formed such that each lower housing portion is precisely received in an associated cavity section, and adjacent cavity sections are linked by branch channels positioned to receive the plastic tethers. PCBAs are then mounted onto each of the lower housing portions such that each plug connector extends over a front edge of its associated lower housing portion and into an associated receptacle, and such that the side and back edges of the lower housing portion are exposed around the PCBA. The upper die of the second molding apparatus is then closed over the lower die, and molten thermoplastic is injected into the cavity network to form upper housing portions on each of the lower housing portions. Note that because the peripheral edges of the lower housing portion are exposed within each cavity section (i.e., with the exception of the front edge portion overlapped by the plug connector), the peripheral edges of the upper housing portions become fused to the peripheral edges of corresponding lower housing portions. As such, when the second molding apparatus is subsequently opened, a strip of completed memory devices linked by tethers is removed, each completed memory device including an integral (i.e., substantially inseparable) housing surrounding an associated PCBA, with its plug connector extending from a front of the integral housing. Finally, the strip is singulated by trimming the tethers to separate the individual memory devices.

In accordance with another embodiment of the present invention, PCBAs are formed as above, but individual lower housing portions are produced in separate cavities of a first molding apparatus. The lower housing portions are then mounted individually into separate cavities of a second molding apparatus. PCBAs are then mounted onto each of the lower housing portions in the manner described above (i.e., with the plug connectors received in receptacles, and such that portions of the front edges adjacent to the plug connector, the side edges and the back edge of each lower housing portion are exposed around the PCBA). The upper die of the second molding apparatus is then closed over the lower die, and molten thermoplastic is injected into the individual cavities to form upper housing portions on each of the lower housing portions. Using this method, when the second molding apparatus is subsequently opened, individual memory devices are produced, thereby eliminating the singulation step required in the embodiment mentioned above.

According to a specific embodiment of the present invention, the plug connector of each PCBA is a Universal Serial Bus (USB) plug connector. In another specific embodiment, the memory devices are formed in accordance with the established ExpressCard form factor.

According to another embodiment of the present invention, the side edges of the PCBA defines alignment notches, and the lower housing portion includes alignment protrusions arranged along its side edges. When the PCBA is mounted onto the lower housing portion, the alignment notches are mounted over corresponding alignment protrusions to precisely align and secure the PCB during the second molding process.

According to an embodiment of the present invention, the lower housing portion includes an open end defined along its front edge such that the plug connector extends over the front edge. The upper housing portion is then molded over the side and back edges of lower housing portion such that a front section of the upper housing is formed on a portion of the plug connector, thus securing the plug connector to the molded housing.

According to yet another embodiment, the lower housing portion is formed with several depressions/grooves that define relatively thin sections of the lower wall, with ribs/thick sections separating adjacent depressions/grooves. The depressions/grooves are positioned such that, when the PCBA is mounted onto the lower housing portion (i.e., before the second molding process), each depression/groove receives a corresponding IC structure, which further facilitates alignment and minimizes the overall height of the memory device. Further, the ribs/thick sections separating adjacent depressions/grooves provide structural rigidity and/or strength that increase the durability of the assembled memory device.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention is directed to pocket-sized, portable computer peripheral devices, and in particular to low-cost memory devices, that are connected by plug connectors (e.g., USB plug connectors) to host computer systems to perform various functions. While the present invention is depicted in particular as a USB memory device, it should be appreciated that the present invention is applicable to any and all pocket-sized computer peripheral device types that are readily transportable and which may be advantageously interconnected with various host computer systems by way of a plug connector. Examples of applications for such portable memory devices include, but are not limited to, flash memory devices and other data storage devices, communications devices, scanners and cameras. The term "host computer system" is used herein to refer to any electronic computer of any type or size including, but not limited to, desktop computers, notebook computers, palmtop computers and personal digital assistant (PDA) devices. Positional terms such as "front", "back", "upper", and "lower" are used for descriptive purposes in the description below and in the claims, and are intended only to describe relative positions of the recited parts, and are not intended to be limited to positions based on a fixed external reference.

Figure 1:
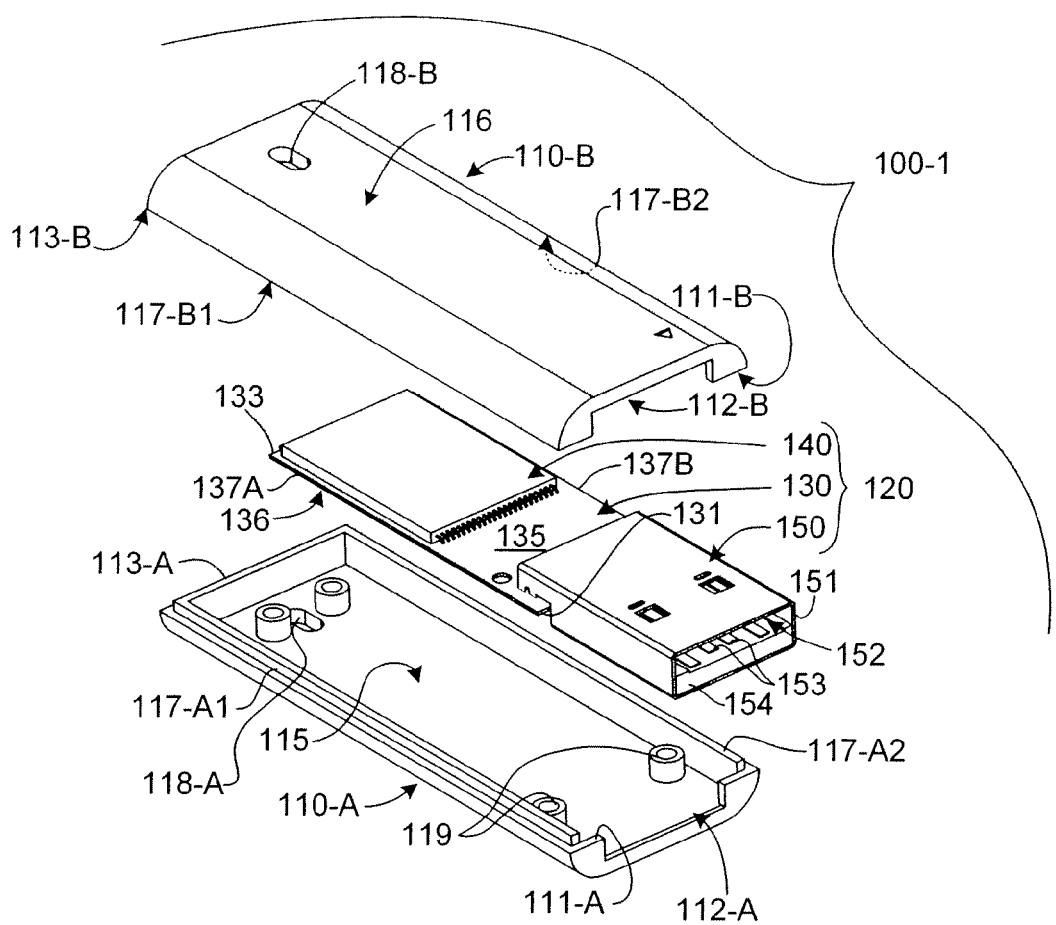
FIG. 1 is an exploded perspective view showing a memory device according to an embodiment of the present invention.
Figure 2:
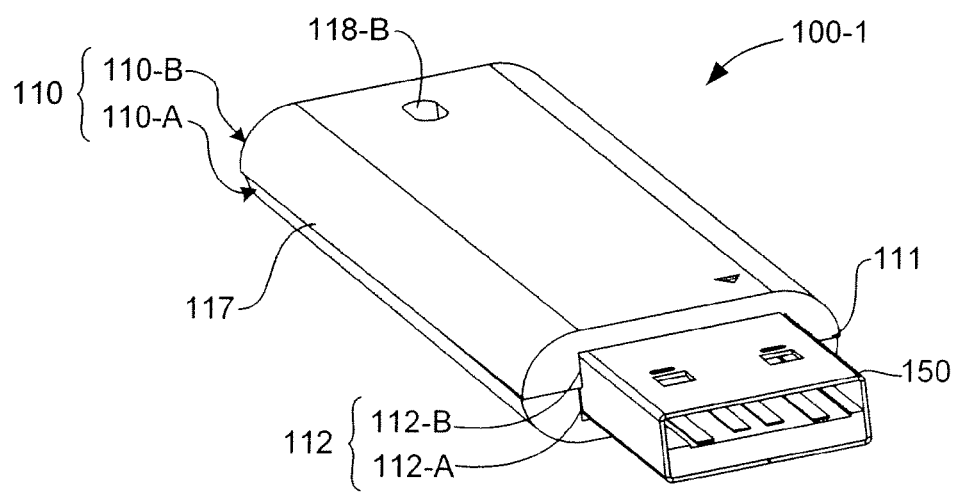
FIG. 2 is a perspective view showing the memory device of FIG. 1 in an assembled state.

FIGS. 1 and 2 are an exploded perspective view and an assembled view, respectively, showing a memory device 100-1 that is produced in accordance with an embodiment of the present invention. Memory device 100-1 generally includes a molded housing 110 and a printed circuit board assembly (PCBA) 120 that is enclosed inside of molded housing 110.

As indicated in FIG. 1, molded housing 110 includes a lower housing portion 110-A and an upper housing portion 110-B that is molded over lower housing portion 110-A such that upper housing portion 110-B is integrally connected (e.g., fused or otherwise permanently connected in the manner described below) to lower housing portion 110-B along its peripheral edges. Lower housing portion 110-A includes a lower wall 115 defining an optional lower (first) through-hole 118-A, and upward-facing peripheral edges surrounding lower wall 115 that include lower side edges 117-A1 and 117-A2, a front edge 111-A defining a (first) front opening portion 112-A, and a rear edge 113-A. Lower housing portion 110-A also includes one or more optional alignment structures (e.g., alignment posts 119 formed on lower wall 115 that are provided to facilitate alignment of PCBA 120). Upper housing portion 110-B includes an upper wall 116 defining an optional upper (second) through-hole 118-B, and downward-facing peripheral edges surrounding upper wall 116 that include upper side edges 117-B1 and 117-B2, a front edge 111-B defining a (second) front opening portion 112-B, and a rear edge 113-B. As mentioned above and discussed in further detail below, both lower housing portion 110-A and upper housing portion 110-B are molded thermoplastic pieces, with the peripheral side edges of upper housing portion 110-B being molded directly onto the peripheral side edges of lower housing portion 110-A (with PCBA 120 mounted in a central region therebetween and plug connector 150 extending through front opening portions 112-A and 112-b). That is, during the upper housing portion molding process, the molten thermoplastic material forming the peripheral edges of upper housing portion 110-B contacts, melts, and inter-diffuses with the thermoplastic material forming the peripheral edges of lower housing portion 110-A. Accordingly, the peripheral edges of lower housing portion 110-A are substantially integrally molded with the peripheral edges of upper housing portion 110-B. In other words, in order to separate lower housing portion 110-A and upper housing portion 110-B in the manner shown in FIG. 1, a knife or other cutting instrument would be needed to slice housing 110 into the two parts. However, such an action will damage or even destroy the housing 110 and make it not useful anymore.

Referring to the central portion of FIG. 1, PCBA 120 includes a printed circuit board (PCB, also referred to as a "substrate") 130, at least one integrated circuit (IC) device (electronic device) 140, and a plug connector 150 that are assembled as described below. PCB 130 is fabricated using standard PCB manufacturing techniques, and, according to an aspect of the present invention, is molded into housing 110 in the manner described below. PCB 130 has a front edge 131, a back edge 133, and opposing upper and lower surfaces 135 and 136 that define a width (i.e., extending between opposing side edges 137A and 137B) that is sized to fit within housing 110 (i.e., less than a width of lower housing portion 110-A). At least one IC device 140 (e.g., a controller circuit and/or a memory circuit, or other electronic component) are mounted on or otherwise electrically connected to PCB 120 (e.g., on upper surface 135 and/or lower surface 136) according to well-established techniques to form an electronic circuit. IC device 140 are operably coupled to connection pins formed on plug connector 150 by way of PCB 130 to perform predetermined computer peripheral functions, such as those mentioned above.

Plug connector 150 is mounted onto front end 131 of PCB 130 and includes a front edge 151 defining a socket opening 152 that faces away from PCB 130, and connection pins 153 formed on a substrate 154 and located inside socket opening 151 are generally aligned in the longitudinal direction defined by housing 110. In the disclosed embodiment, plug connector 150 is a Universal Serial Bus (USB) plug connector that is electrically connected to IC device 140 through contacts and conductive traces (not shown) that are formed on PCB 130 using known techniques. As indicated in FIG. 2, when memory device 100-1 is produced, plug connector 150 is rigidly supported by and extends from a front end of housing 110 for engagement into a socket of a host system in the manner described below. Note that the optional through-holes (e.g., upper through-hole 118-B) may be utilized to expose an indicator light, such as a light emitting diode (LED) structure that is operably provided on the PCBA.

Figure 3:
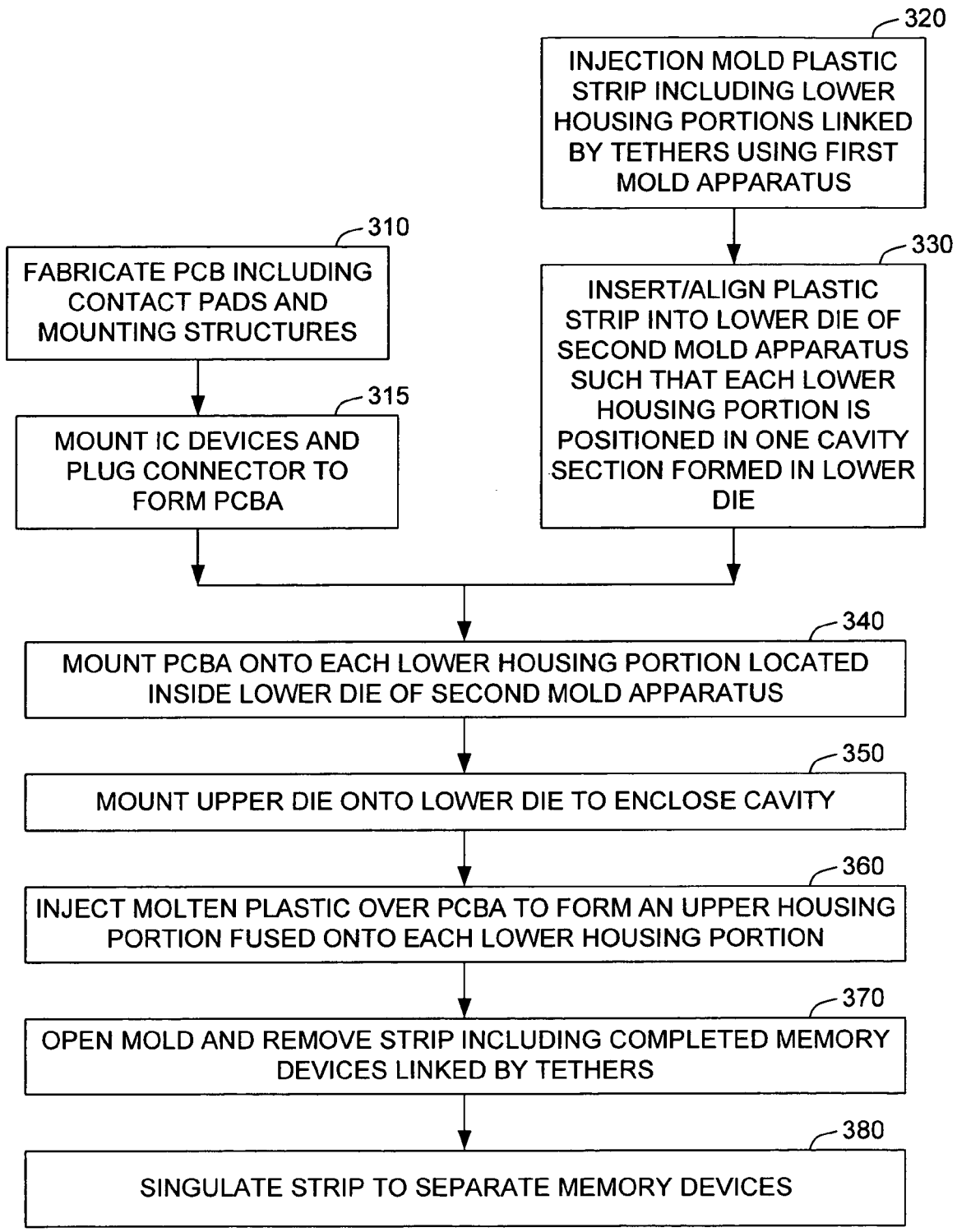
FIG. 3 is a flow diagram showing a method for producing the memory device shown in FIG. 1 according to another embodiment of the present invention.

FIG. 3 is a flow diagram depicting a simplified method for manufacturing portable memory devices, such as USB memory device 100-1 (FIGS. 1 and 2), according to an embodiment of the present invention. This method is further illustrated with reference to FIGS. 4(A) through 7, which illustrate simplified molding equipment and individual components of exemplary portable memory devices during various stages of production.

Referring to the top left of FIG. 3, a PCB is manufactured according to known PCB fabrication techniques (block 310), and then a plug connector, IC devices and other components are mounted (e.g., soldered) onto the PCB to form a PCBA (block 315). An exemplary PCBA 120 is shown in FIG. 1 and described above.

Referring to the top right of FIG. 3, concurrent with, before, or after the fabrication of the PCBA, a plastic strip including several lower housing portions linked by plastic tethers is fabricated using a first molding apparatus, for example, by well-known plastic injection molding techniques (block 320).

Figure 4A:
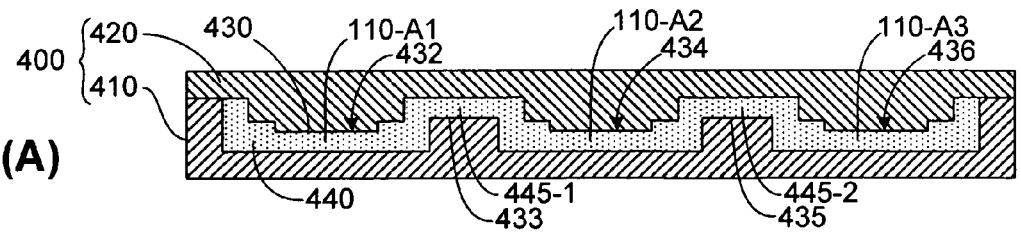
FIGS. 4(A), 4(B), 4(C), 4(D), 4(E), and 4(F) are cross-sectional end views showing exemplary molding apparatus and memory device portions during production according to the method of FIG. 3.
Figure 5:
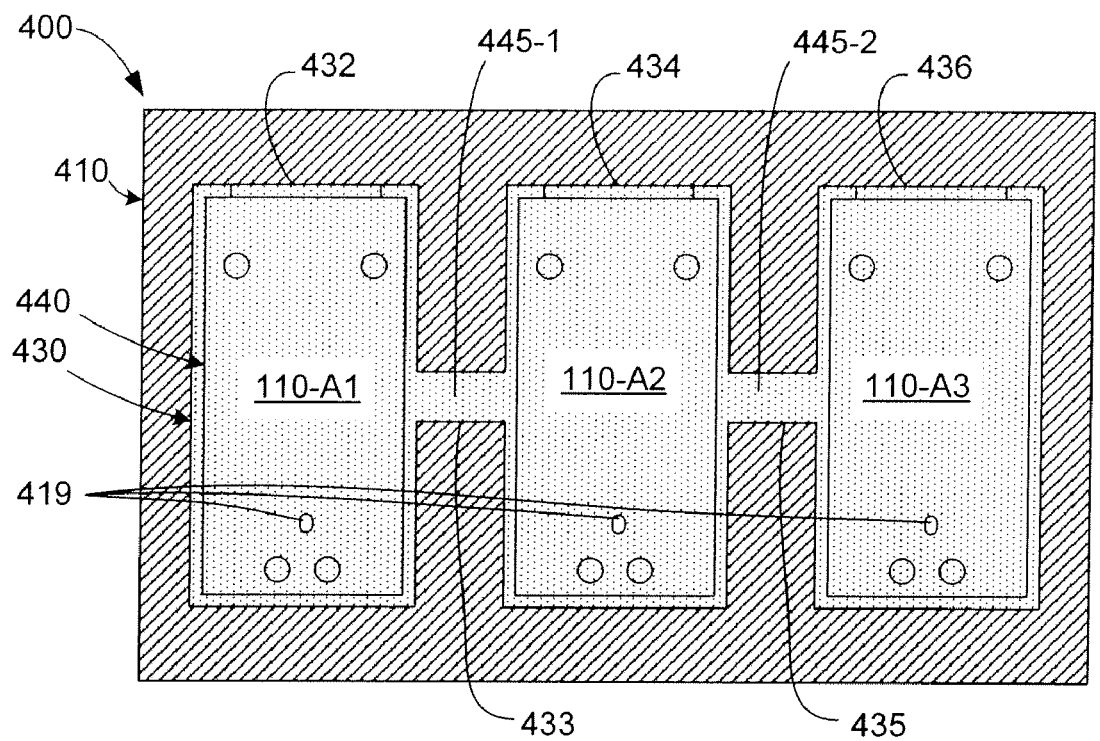
FIG. 5 is a simplified top view showing a first molding apparatus used by the method of FIG. 3 in accordance with an embodiment of the present invention.

FIGS. 4(A) and 5 are cross-sectional side and top views, respectively, showing a simplified exemplary (first) molding apparatus 400 including a lower die 410 and an upper die 420 that are constructed using known techniques to provide a cavity network 430 including multiple cavity sections 432, 434, and 436 that communicate with adjacent cavity sections by way of branch channels 433 and 435. For example, cavity section 432 communicates with adjacent cavity section 434 by way of branch channel 433. As indicated in these figures, when thermoplastic material is injected into cavity network 430, plastic material fills both the cavity sections and the branch channels, thereby forming a plastic strip 440 including several linked lower housing portions 110-A1 through 110-A3, where each lower housing portion is connected to an adjacent lower housing portion by a plastic tether 445-1 or 445-2 that is formed in an associated branch channel during injection of the thermoplastic material. For example, lower housing portion 110-A1, which is formed in cavity section 432, is linked to lower housing portion 110-A2, which is formed in cavity section 434, by plastic tether 445-1, which is formed in branch channel 433.

Figure 6:
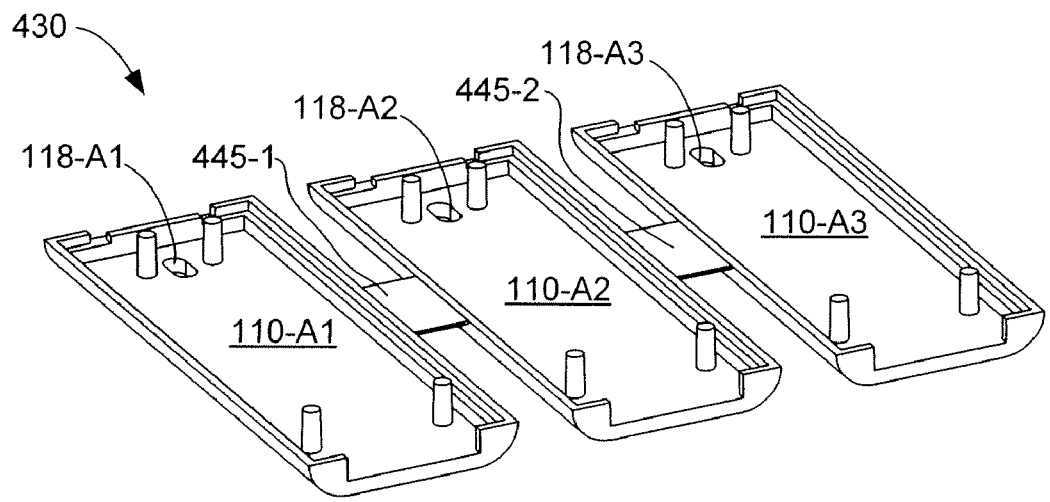
FIG. 6 is a perspective view showing a plastic strip generated by the molding apparatus of FIG. 5 according to an embodiment of the present invention.

FIG. 6 is a perspective view showing exemplary plastic strip 440 in additional detail. Note that plastic tethers 445-1 and 445-2 may have any size and cross-section, so long as the resulting structure provides a suitable rigidity and durability. Further it is noted here that, although plastic strip 400 includes three lower housing portions 110-A1 through 110-A3 and two tethers, those skilled in the art will recognize that a plastic strip may be produced having any number of lower housing portions connected by any number of tethers. In addition, the single tether such as 445-1 between the lower housing portions 110-A1 and 110-A2 is merely meant to be exemplary, and should not be considered to be limiting. Further, the parallel arrangement of housing portions 110-A1 through 110-A3 is exemplary and not intended to be limiting.

As indicated in the lower portion of FIG. 5 and FIG. 6, upper die 420 and/or lower die 410 include an optional pin-like structure 419 that is positioned to produce lower through-holes 118-A1, 118-A2 and 118-A3.

Returning to FIG. 3, after the first molding process is completed, the plastic strips (e.g., plastic strip 400, shown in FIG. 6) is removed from the first molding apparatus, and is transported to a second molding apparatus, where it is inserted and aligned into a lower die thereof such that each linked lower housing portion of the plastic strip is positioned in an associated cavity formed in the lower die (block 330). One PCBA is then mounted onto each of the linked lower housing portions (block 340), the upper die of the second molding apparatus is secured to enclose the plastic strip and PCBAs (block 350), and then molten thermoplastic material is injected into the second molding apparatus to form upper housing portions over each of the linked lower housing portions (block 360).

Figure 4B:
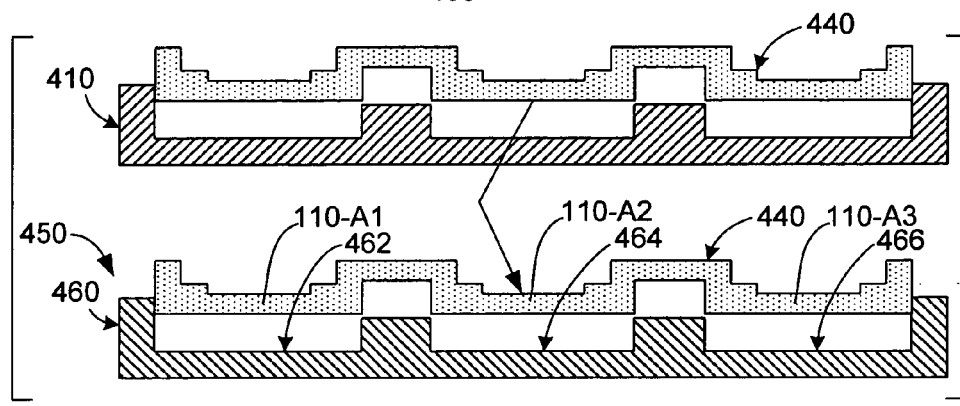
Figure 4C:
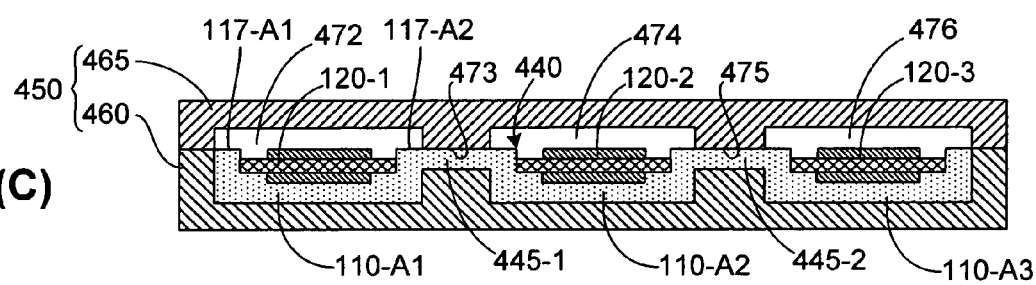
Figure 4D:
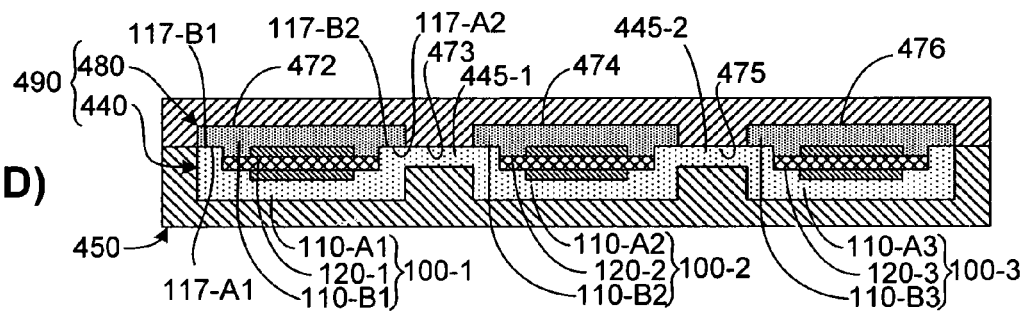

FIGS. 4(B) through 4(D) are cross-sectional end views depicting the transfer of plastic strip 400 to a second molding apparatus 450, and subsequent formation of upper housing portions. FIG. 4(B) depicts the removal of plastic strip 400 from lower die 410 of first molding apparatus 400, and inserting into a lower die 460 of second molding apparatus 450. FIG. 4(B) shows that plastic strip 400 is aligned within lower die 460 such that first lower housing portion 110-A1 is received in a first cavity section 462, second lower housing portion 110-A2 is received in a second cavity section 464, and third lower housing portion 110-A3 is received in a third cavity section 466. FIG. 4(C) depicts second molding apparatus 450 after PCBAs 120-1 through 120-3 have been respectively mounted onto linked lower housing portions 110-A1 through 110-A3, and upper die 465 is secured onto lower die 460. Similar to the first molding apparatus, second molding apparatus 450 defines a cavity network that includes cavity portions 472, 474, and 476, which respectively includes a suitable open region over the associated lower housing portions and PCBAs. As indicated in FIG. 4(D), when thermoplastic material is subsequently injected into cavity network 470, the plastic material fills the open spaces to form a structure 480 including upper housing portions 110-B1 through 110-B3, which are formed on lower housing portions 110-A1 through 110-A3 and PCBAs 120-1 to 120-3, respectively, thereby forming linked memory devices 100-1 through 100-3.

According to an aspect of the present invention, because the peripheral edges of lower housing portions 110-A1 through 110-A3 are exposed within cavity sections 472, 474 and 476, respectively, the peripheral edges of the upper housing portions 110-B1 through 110-B3 become fused to the peripheral edges of corresponding lower housing portions 110-A1 through 110-A3 to form integral housings that are both highly durable and aesthetically appealing. For example, as indicated at the left side of FIG. 4(C), side edges 117-A1 and 117-A2 of lower housing portion 110-A1 are exposed inside cavity section 472 prior to the second molding process, and, as shown in FIG. 4(D) side edges 117-B1 and 117-B2 of upper housing portion 110-B1 are formed directly on side edges 117-A1 and 117-A2 of lower housing portion 110-A1. The injected molten thermoplastic material associated with upper housing portion 110-B1 thus causes partial melting of the previously cooled thermoplastic material associated with lower housing portion 110-A1, which results in inter-diffusion that produces a permanent and highly durable bond between the upper and lower housing portions.

Figure 4E:
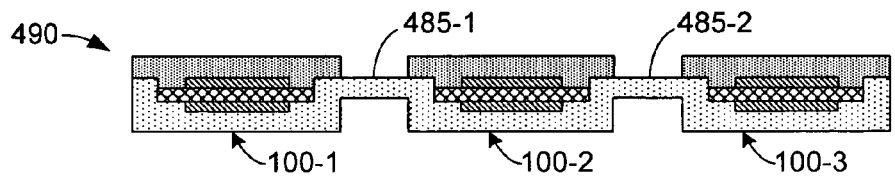

Referring to FIG. 4(C), note that plastic tethers 445-1 and 445-2 are respectively received in branch channels 473 and 475. As indicated on the left side of FIG. 4(D) and in FIG. 4(E), lower plastic strip 440, upper plastic structure 480, and the PCBAs secured therein form a device strip 490 that effectively includes three memory devices 100-1, 100-2, and 100-3 linked by tether structures 445-1 and 445-2. As indicated in FIG. 4(E), device strip 490 is thus removed from the second molding apparatus in one piece.

Figure 7A:
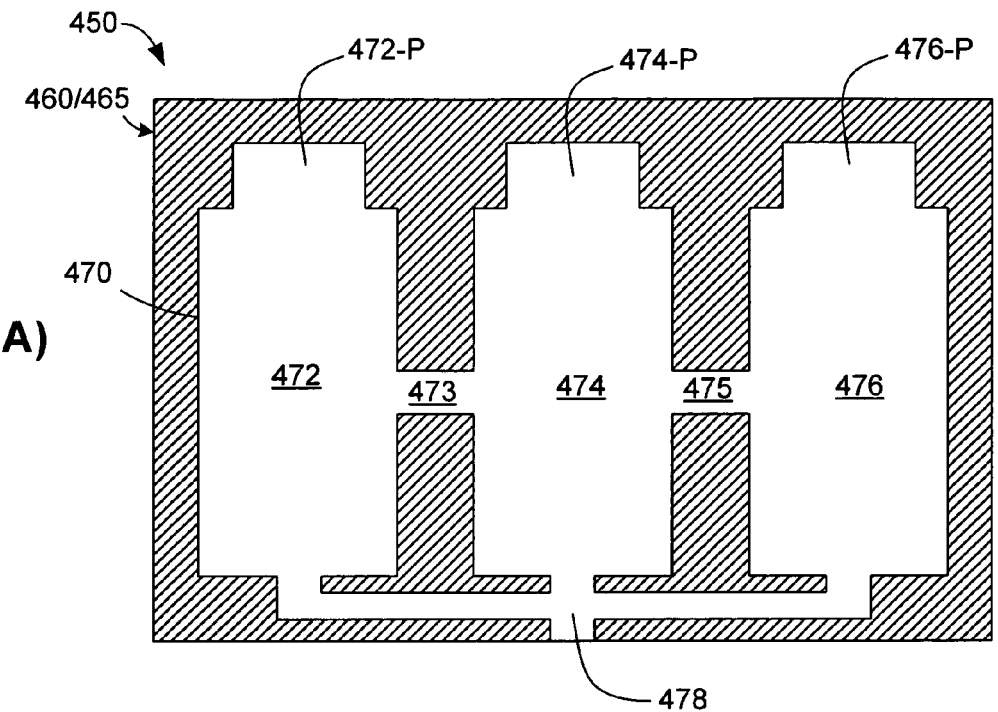
FIGS. 7(A), 7(B), 7(C), and 7(D) are top views showing a second molding apparatus used by the method of FIG. 3 in accordance with an embodiment of the present invention.
Figure 7B:
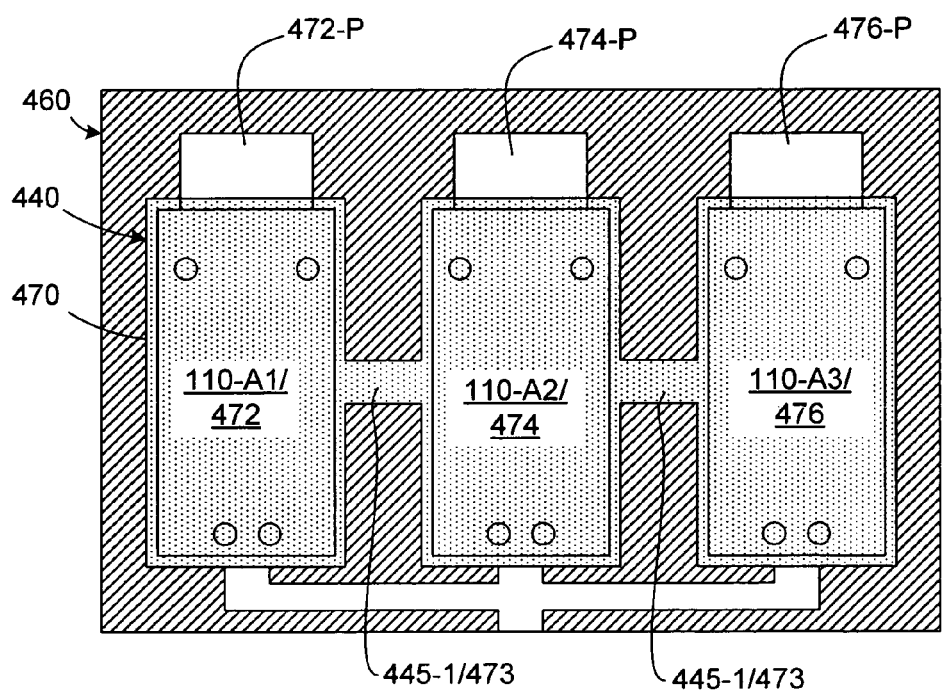
Figure 7C:
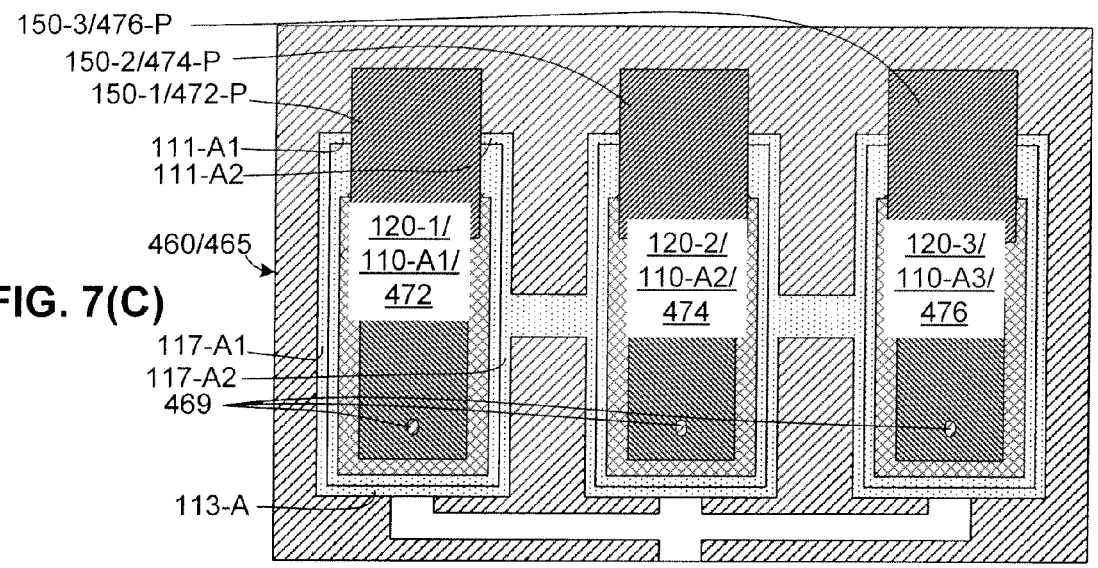
Figure 7D:
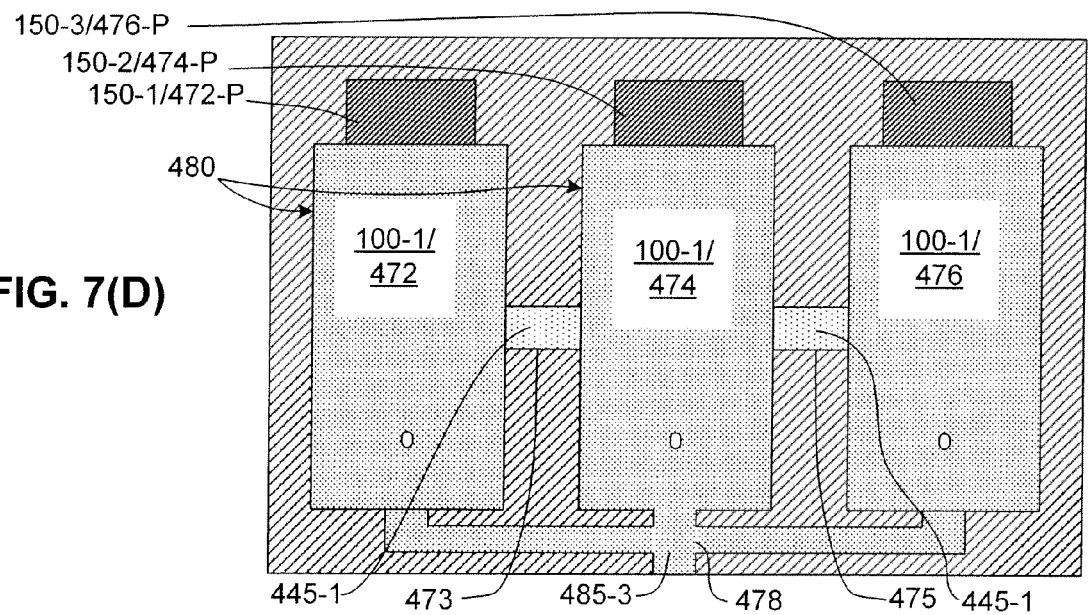

According to another aspect of the present invention, second molding apparatus 450 clamps over the plug connectors of each PCBA to prevent molten thermoplastic material from entering or otherwise damaging the plug connectors. FIGS. 7(A) through 7(D) illustrate this clamping process by showing second molding apparatus 450 from a top view during the second molding process. As indicated in FIG. 7(A), cavity sections 472, 474, and 476 of cavity network are linked by branch channels 473 and 475, and also include plug receptacle regions 472-P, 474-P and 476-P. Note that an entrance channel 478 is indicated at the lower portion of FIG. 7(A), which functions as a passage for incoming injected thermoplastic according to known practices. As shown in FIG. 7(B), when plastic strip 440 is inserted into lower die 460, plastic strip 440 only fills a portion of cavity network 470 (i.e., in particular, no portion of plastic strip 440 enters plug receptacle regions 472-P, 474-P and 476-P). Next, as shown in FIG. 7(C), when PCBAs 120-1 through 120-3 are mounted onto linked lower housing portions 110-A1 through 110-A3, plug connectors 150-1 through 150-3 are received within portions of plug receptacle regions 472-P, 474-P and 476-P that are defined by lower die 460. When upper die 465 is subsequently secured onto lower die 460, a corresponding portion of plug receptacle regions 472-P, 474-P and 476-P is clamped (i.e., tightly fitted) onto plug connectors 150-1 through 150-3, respectively. That is, unlike the main portion of cavity sections 472, 474, and 476, which provide space for the formation of upper housing portions 110-B1 through 110-B3 (e.g., as indicated in FIG. 4(C), plug receptacle regions 472-P, 474-P and 476-P are formed such that the corresponding portions of upper die 465 and lower die 460 tightly pinch plug connectors 120-1 through 120-3 to prevent molten thermoplastic material from entering these regions. Thus, as shown in FIG. 7(D), even though plastic material flows into entrance channel 478 to form a waste tab 485-3, no portion of second plastic structure 480 is formed over plug connectors 120-1 through 120-3. Accordingly, as shown in FIG. 8, when device strip 490 is removed from the second molding apparatus, it includes memory devices 100-1 through 100-3 in a substantially completed form (i.e., with plug connectors 150-1 through 150-3 extending from front walls 111-1 through 111-3), but still linked by tether structures 445-1 and 445-2.

Figure 8:
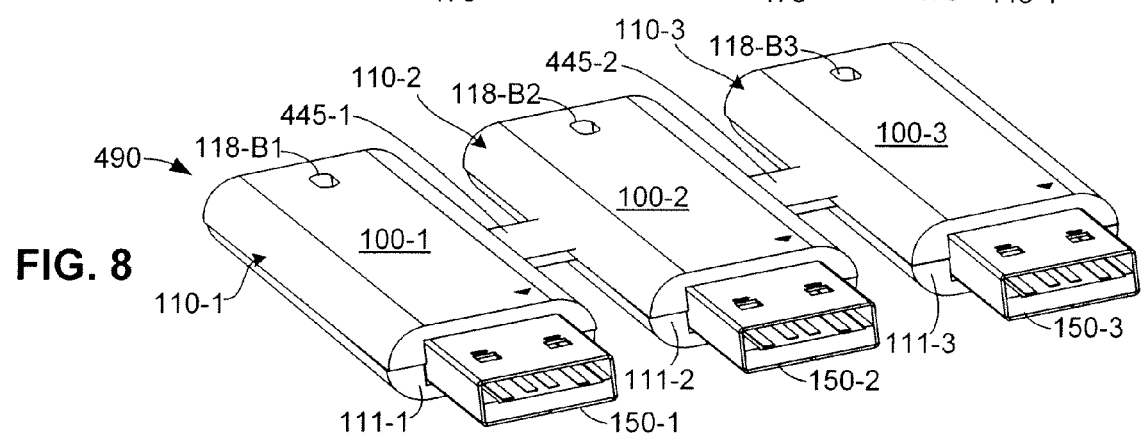
FIG. 8 is a perspective view showing a strip including several memory devices produced by the molding apparatus of FIG. 6(D) in accordance with an embodiment of the present invention.

Referring briefly to FIG. 7(C), upper die 465 includes an optional pin-like structure 469 that is positioned to produce optional upper through-holes 118-B1, 118-B2 and 118-B3, which are shown in FIG. 8.

According to another aspect, front edge portions of each lower housing portion are exposed on both sides of each plug connector, as are side and back edges of the lower housing, thus allowing the upper housing portion to seal each PCBA inside in a manner that both protects the PCBAs, and provides a rigid support for the plug connector. For example, referring to the right side of FIG. 7(C), front edge sections 111-A1 and 111-A2 are exposed on opposite sides of plug connector 150-1, and side edges 117-A1/117-A2 and back edge 113-A are also exposed. Accordingly, when the molten thermoplastic material is injected into cavity portion 472, an upper housing is formed that both protectively seals PCBA 120-1 inside, and provides a rigid support structure along the side edges of plug connector 150-1.

Figure 4F:
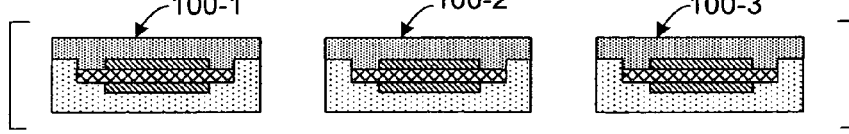

Returning to FIG. 3, after the second molding process is completed, the second molding apparatus is opened, the device strip including multiple completed memory devices linked by tether structures is removed (block 370). As mentioned above with reference to FIG. 8, device strip 490 includes completed memory devices 100-1 through 100-3, each having an integral (i.e., substantially inseparable) molded housing 100-1 through 110-3 surrounding an associated PCBA, with an associated plug connector 150-1 through 150-3 extending from front walls 111-1 through 111-3, respectively, thereof. Finally, a cutting tool (not shown) is utilized to singulate the linked memory devices 100-1 through 100-3 (i.e., to remove tether structures 445-1 and 445-2) (block 380), thereby providing individual memory devices 100-1 through 100-3, as shown in FIG. 4(F). Accordingly, the present invention minimizes costs by utilizing two molding apparatuses to eliminate costly manual assembly procedures needed for conventional memory devices having two-part, individually molded housing structures.

Figure 9:
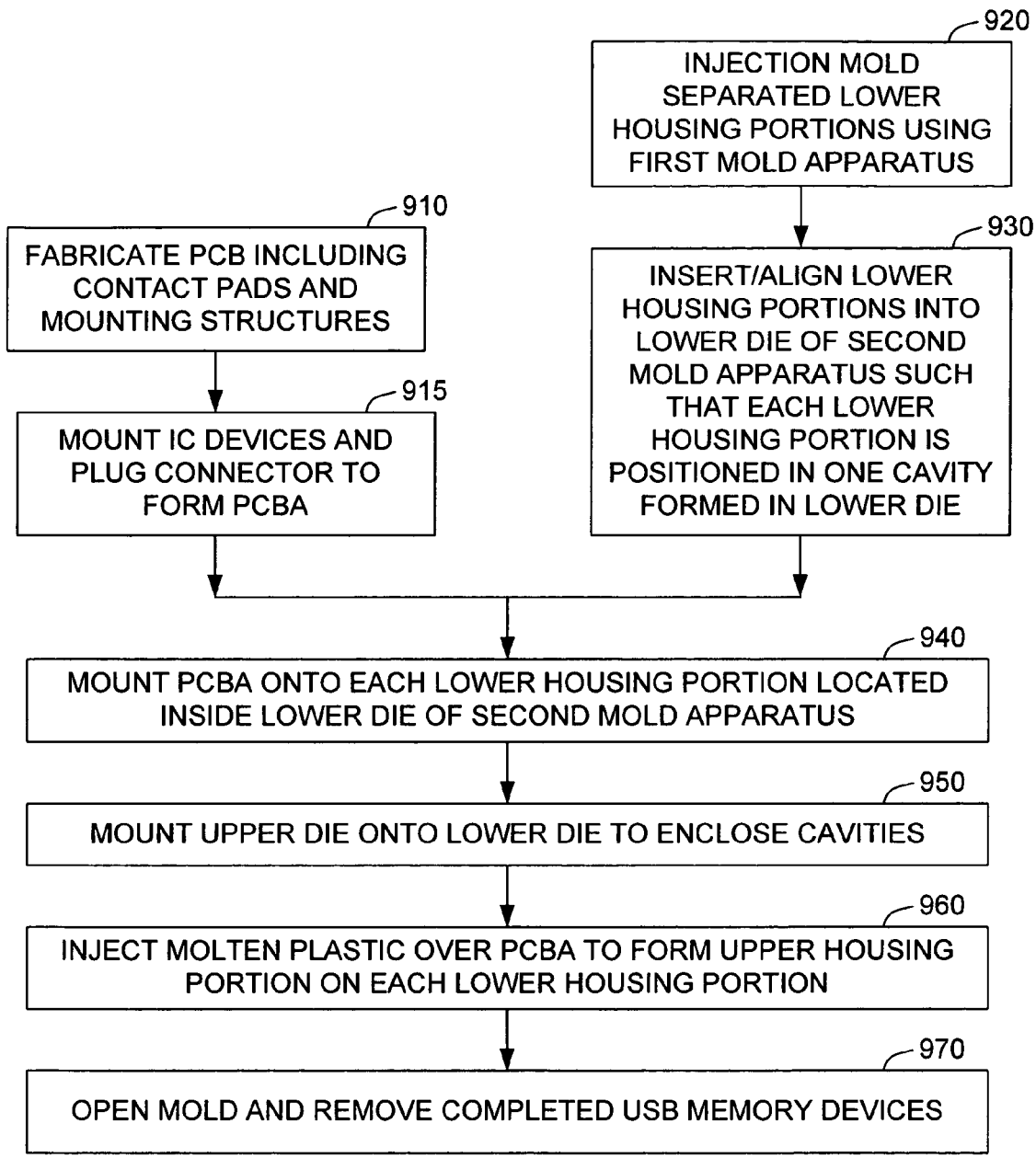
FIG. 9 is a flow diagram showing a method for producing the memory device shown in FIG. 1 according to another embodiment of the present invention.

FIG. 9 is a flow diagram depicting a simplified method for manufacturing portable memory devices according to an alternative embodiment of the present invention. This alternative method differs from the embodiment described above in that, instead of forming a strips of lower housing portions that must be singulated, individual lower housing portions are produced in separate cavities, thus allowing completed and substantially separated devices to be removed from the second molding apparatus. The method of FIG. 9 is further illustrated with reference to FIGS. 10(A) through 13(D), which illustrate simplified molding equipment and individual components of exemplary portable memory devices during various stages of production according to the alternative embodiment associated with FIG. 9.

Figure 10A:
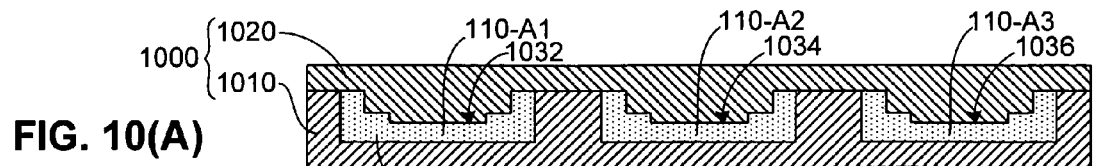
FIGS. 10(A), 10(B), 10(C), 10(D), and 10(E) are cross-sectional end views showing molding apparatus and portions of the memory device during production according to the method of FIG. 9.
Figure 10B:
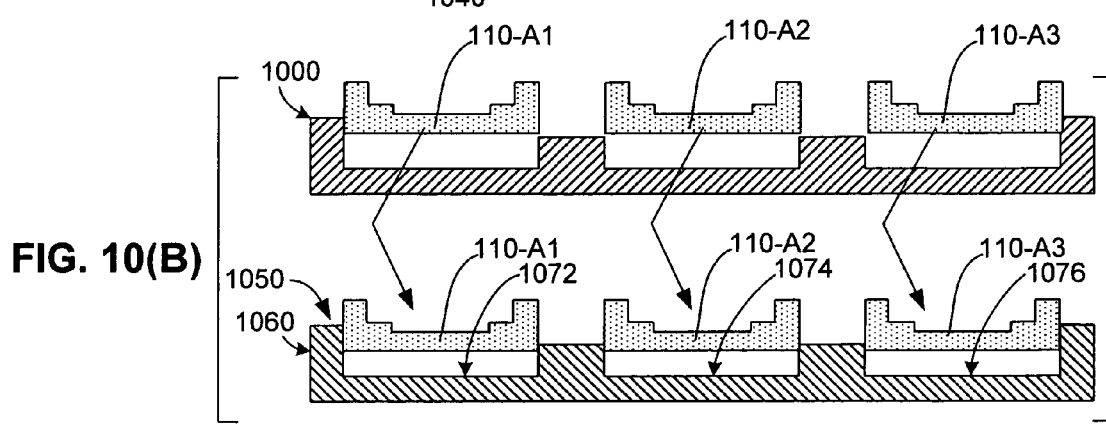

Referring to the top left of FIG. 9, PCBA production is carried out essentially as described above (blocks 910 and 915). Referring to the top right of FIG. 9, several individual lower housing portions are fabricated using a first molding apparatus (block 920). However, as shown in FIGS. 10 and 11, a first molding apparatus 1000 of this embodiment includes a lower die 1010 and an upper die 1020 that are constructed to provide individual (i.e., substantially isolated) cavities 1032, 1034, and 1036, which are used to produce lower housing portions 110-A1 through 110-A3 during injection of the thermoplastic material associated with a first molding process. FIG. 11 is a perspective view showing exemplary lower housing portions 110-A1 through 110-A3 produced by first molding apparatus 1000.

Returning to FIG. 9, the lower housing portions are transported to a second molding apparatus, where they are inserted and aligned into individual cavities formed in the lower die thereof (block 930). This process is depicted in FIG. 10(B), where lower housing portions 110-A1 through 110-A3 are shown being moved from first molding apparatus 1000 to lower die 1060 of second molding apparatus 1050, which each lower housing portion 110-A1 through 110-A3 being received in cavities 1072, 1074 and 1076, respectively.

Next, one PCBA is then mounted onto each of the lower housing portions (block 940; FIG. 9), the upper die of the second molding apparatus is secured to enclose the plastic strip and PCBAs (block 950), and then molten thermoplastic material is injected into the second molding apparatus to form upper housing portions over each of the lower housing portions (block 960).

Figure 10C:
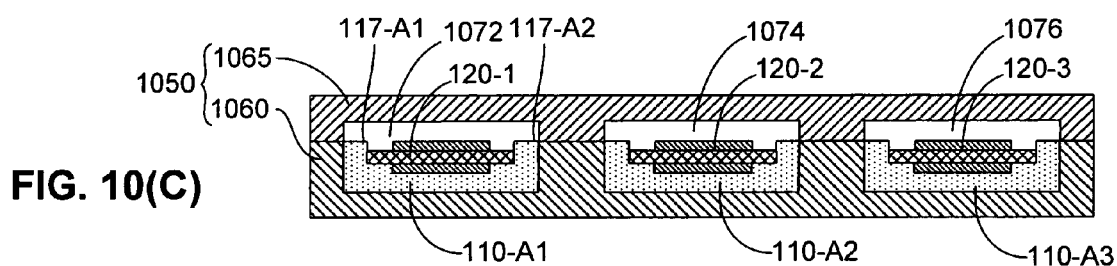
Figure 10D:
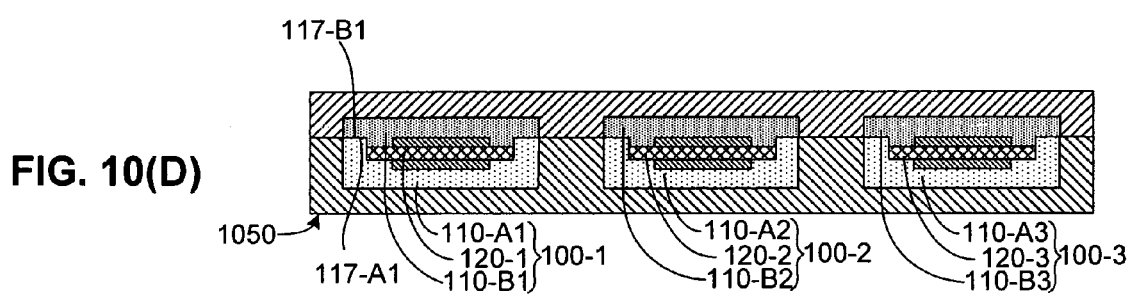
Figure 11:
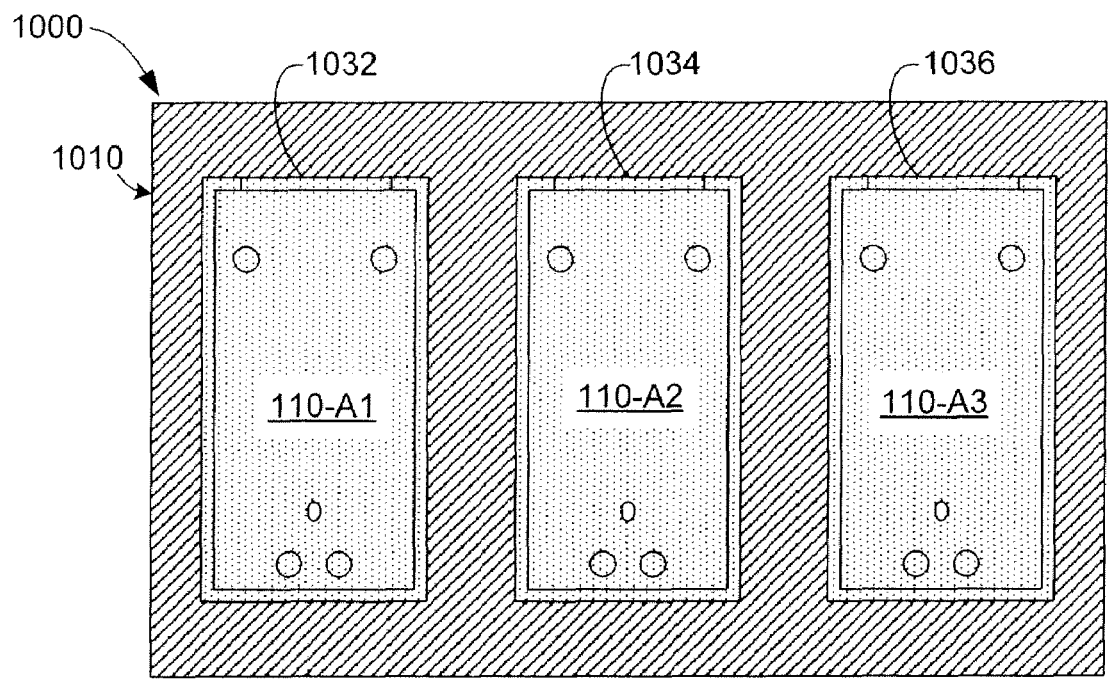
FIG. 11 is a simplified top view showing a first molding apparatus used by the method of FIG. 9 in accordance with an embodiment of the present invention.
Figure 12:
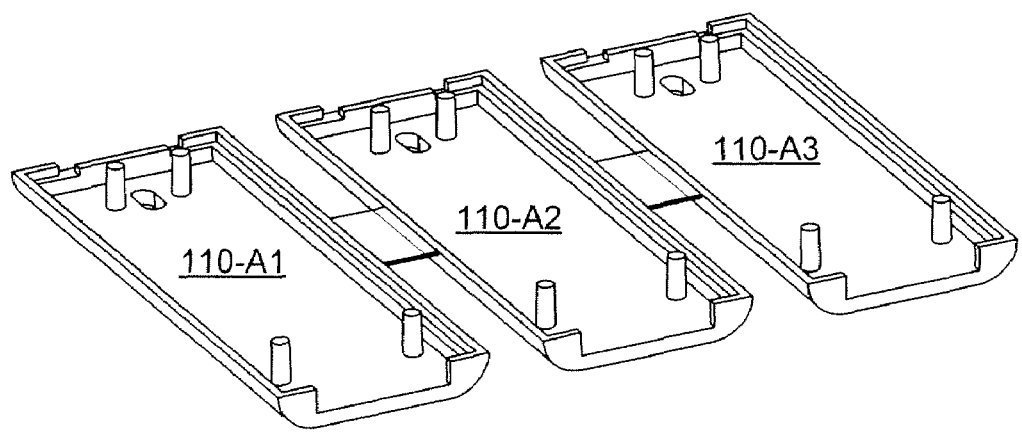
FIG. 12 is a perspective view showing lower housing portions generated by the molding apparatus of FIG. 11 according to an embodiment of the present invention.

FIGS. 10(C) and 10(D) depict second molding apparatus 1050 after PCBAs 120-1 through 120-3 have been respectively mounted onto lower housing portions 110-A1 through 110-A3, and upper die 1065 is secured onto lower die 460. Similar to first molding apparatus 1000, second molding apparatus 1050 defines individual cavities 1072, 1074, and 1076, which respectively includes a suitable open region over the associated lower housing portions and PCBAs. As indicated in FIG. 10(D), when thermoplastic material is subsequently injected into cavities 1072, 1074, and 1076, the plastic material fills the open spaces to form upper housing portions 110-B1 through 110-B3 on lower housing portions 110-A1 through 110-A3, respectively. Similar to the embodiment described above, because the peripheral edges of lower housing portions 110-A1 through 110-A3 (e.g., side edges 117-A1 and 117-A2, shown in FIGS. 10(C) and 13(C), along with front edge portions 111-A1/111-A2 and back edge portion 113-A, shown in FIG. 13(C)) are exposed within cavities 1072, 1074 and 1076, respectively, the peripheral edges of the upper housing portions 110-B1 through 110-B3 become fused to the peripheral edges of corresponding lower housing portions 110-A1 through 110-A3 to form integral housings.

Figure 13A:
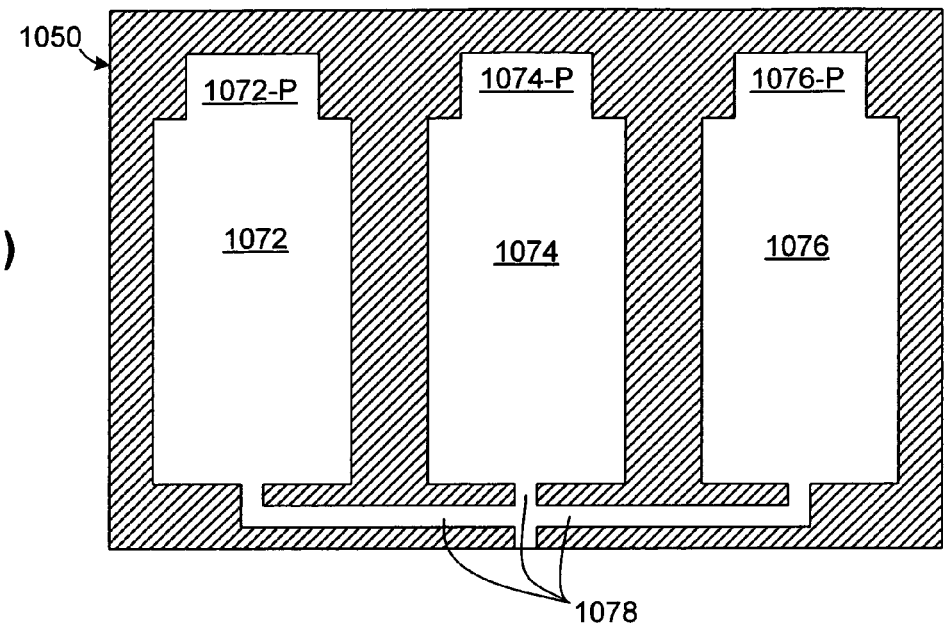
FIGS. 13(A), 13(B), 13(C), and 13(D) are top views showing a second molding apparatus used by the method of FIG. 9 in accordance with an embodiment of the present invention.
Figure 13B:
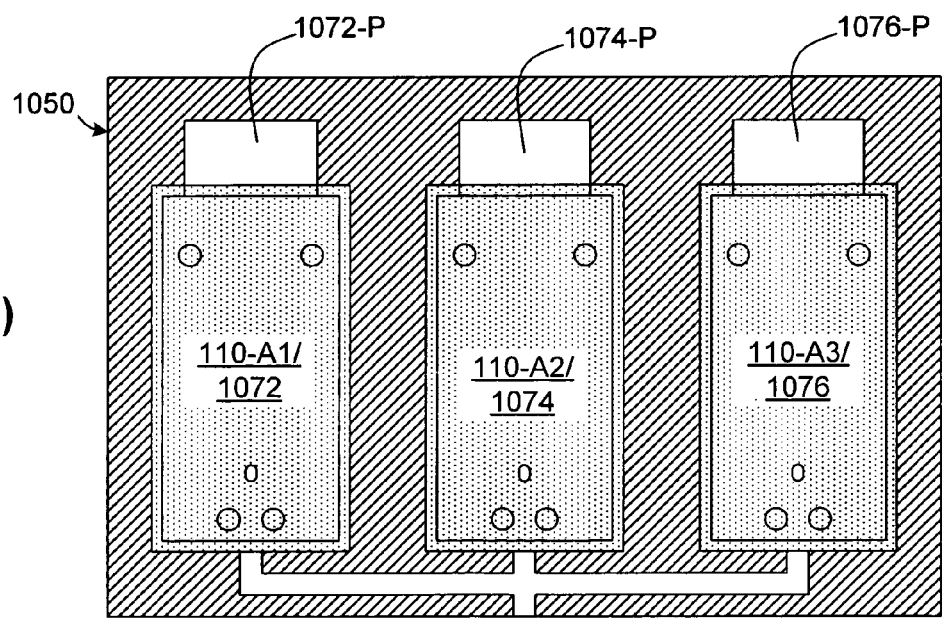
Figure 13C:
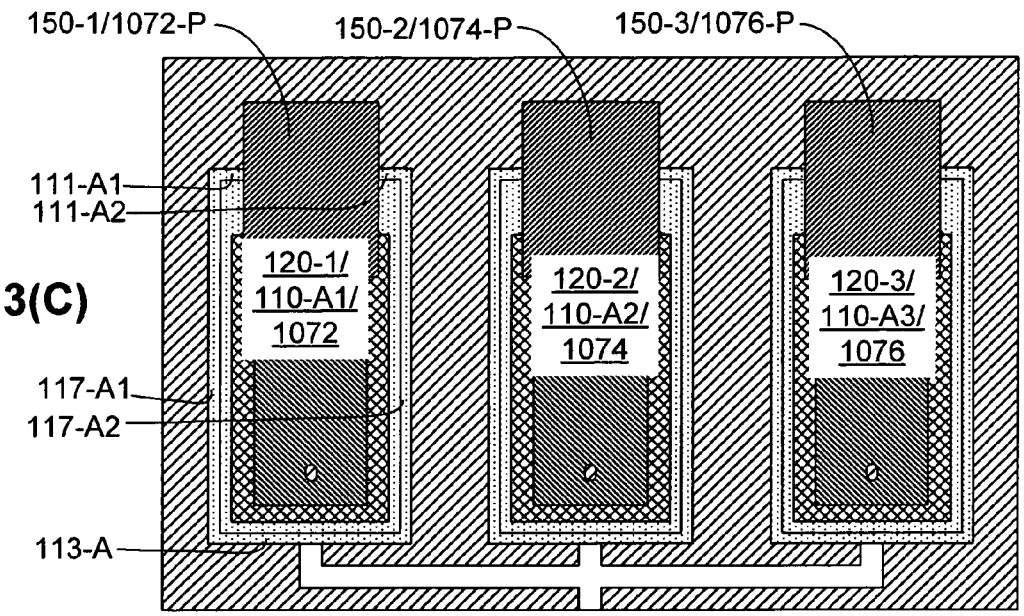
Figure 13D:
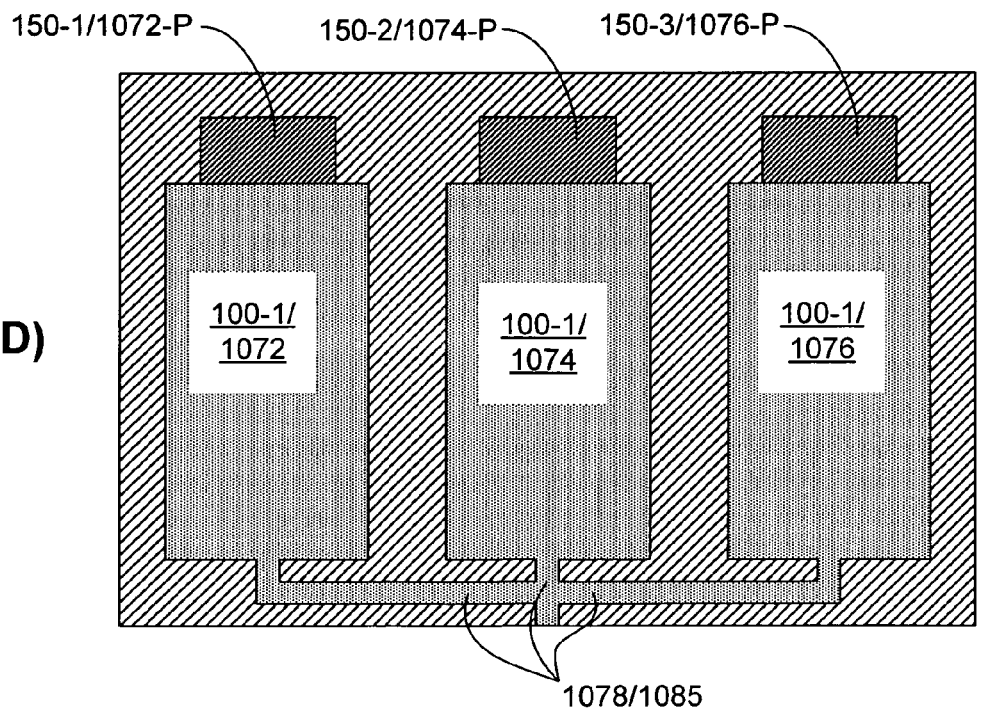

Similar to the first embodiment, as shown in FIGS. 13(A) to 13(D), second molding apparatus 1050 clamps over the plug connectors of each PCBA to prevent molten thermoplastic material from entering or otherwise damaging the plug connectors. As indicated in FIG. 13(A), cavity sections 1072, 1074, and 1076 include plug receptacle regions 1072-P, 1074-P and 1076-P. Note that a channel 1078 is indicated at the lower portion of FIG. 13(A), which functions as an entrance port for incoming thermoplastic according to known practices, but does not produce a tether that must be cut after molding is completed (i.e., the thin residual plastic piece is easily removed manually upon completion of the molding process). As shown in FIG. 13(B), when lower housing portions 110-A1 through 110-A3 are inserted into cavity sections 1072, 1074, and 1076 of second molding apparatus 1050, no portion enters plug receptacle regions 1072-P, 1074-P and 1076-P). Next, as shown in FIG. 13(C), when PCBAs 120-1 through 120-3 are mounted onto lower housing portions 110-A1 through 110-A3, plug connectors 150-1 through 150-3 are received within portions of plug receptacle regions 1072-P, 1074-P and 1076-P that are defined by lower die 1060. When upper die 1065 is subsequently secured onto lower die 1060, a corresponding portion of plug receptacle regions 1072-P, 1074-P and 1076-P is clamped (i.e., tightly fitted) onto plug connectors 150-1 through 150-3, respectively, in the manner described above. Thus, as shown in FIG. 13(D), even though plastic material enters cavities 1072, 1074 and 1076 and flows in entrance channel 1078 to form an excess tab 1085, no plastic forms over plug connectors 120-1 through 120-3. Tab 1085 will easily be removed using known practices.

Figure 10E:
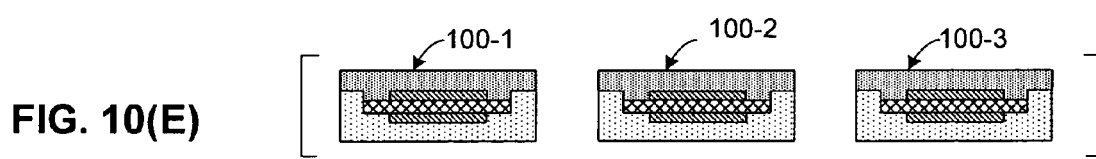

Returning to FIG. 9, after the second molding process is completed, the second molding apparatus is opened, and individual memory devices 100-1 through 100-3 are removed (block 970 and FIG. 10(E)). Accordingly, the present embodiment minimizes costs in the manner described above with reference to the first embodiment, and also eliminates the need for the singulation process required in the first embodiment.

Figure 14:
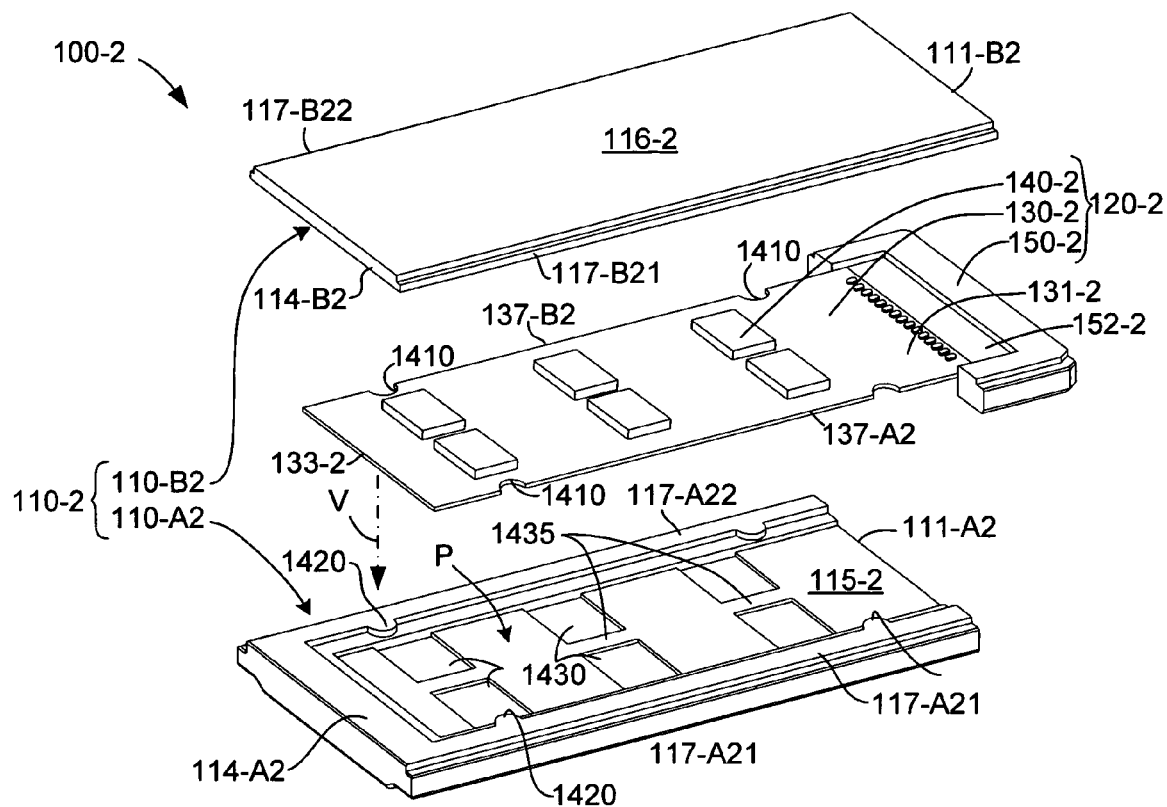
FIG. 14 is an exploded perspective view showing a memory device according to another embodiment of the present invention.
Figure 15:
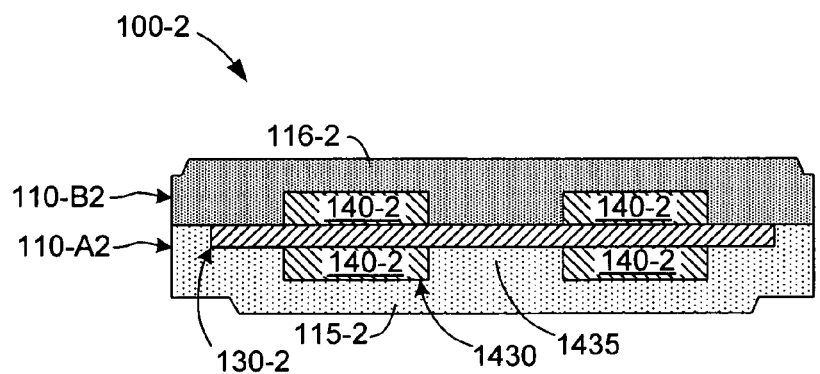
FIG. 15 is a simplified cross-sectional end view showing a portion of the memory device of FIG. 14.
Figure 16:
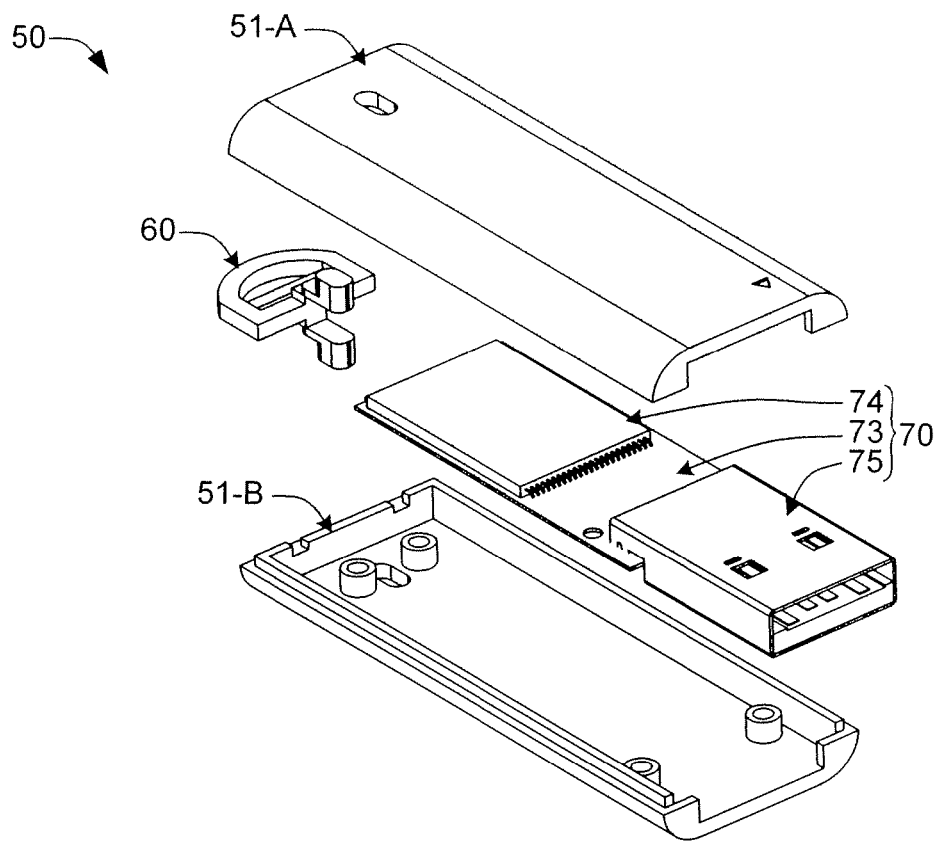
FIG. 16 is an exploded perspective view showing a conventional memory device.
Figure 17:
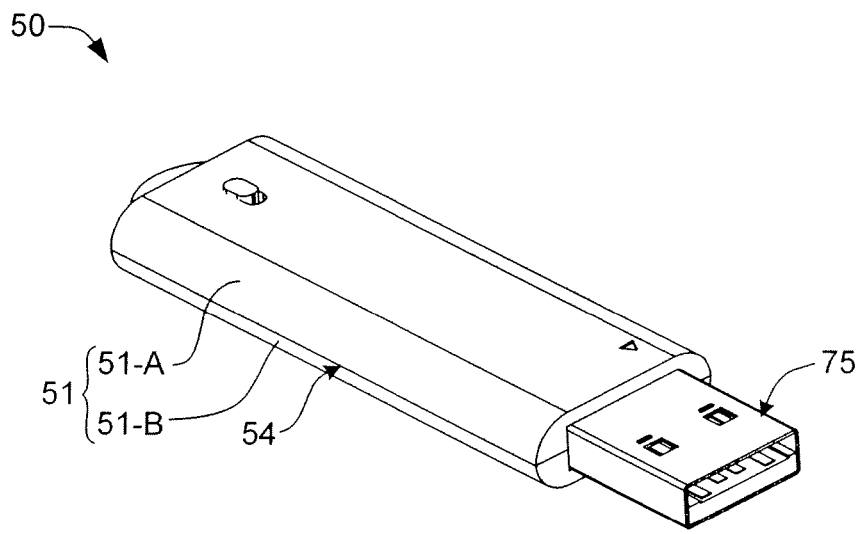
FIG. 17 is a simplified cross-sectional end view showing a portion of the conventional memory device of FIG. 16.

While the present invention has been described above with reference to several specific embodiments, these embodiments are intended to be exemplary and not limiting. For example, the present invention may be utilized to produce memory devices other than USB pen-type memory device 100 described above. One such alternative memory device 100-2 is illustrated in FIGS. 14 and 15, which shows a PCMCIA card-like memory device 100-2 commonly referred to as a "PC card", and in particular to a modern, small form factor PC card constructed in accordance with the ExpressCard™/34 Module or developed by Intel Corp. of Santa Clara, Calif., which is has a length of 75 mm, a width of 34 mm, and a thickness (height) of 5 mm). FIG. 14 shows PC card 100-2 in an exploded perspective manner, and FIG. 15 is a cross-sectional end view of PC card 100-2 after assembly.

Referring to the center of FIG. 14, PCBA 120-2 generally includes a PCB 130-2, several IC devices 140-2, and a connector 150-2. PCB 130-2 is sized generally according to a predefined form factor (e.g., consistent with the PCI Express Architecture developed by Intel Corp. of Santa Clara, Calif.), and includes parallel side edges 137-A2 and 137-B2, and parallel front and rear end edges 131-2 and 133-2 located at respective ends of side edges 137-A2 and 137-B2. Connector 150-2, which also conforms to the selected form factor, is mounted onto front edge 131-2 of PCB 130-2, and is operably attached according to well-known practices.

Referring to the upper and lower portions of FIG. 14, molded housing 110-2 includes a lower housing portion 110-A2 and an upper housing portion 110-B2 that are integrally molded according to the methods described above. Lower housing portion 110-A2 includes a lower wall 115-2, parallel side edges 117-A21 and 117-A22, and a rear edge 114-A2. Upper housing portion 110-B2 includes an upper wall 116-2, parallel side edges 117-B21 and 117-B22, and a rear edge 114-B2.

According to an embodiment of the present invention, instead of the alignment structures utilized in the embodiment described above, side edges 137-A2 and 137-B2 define alignment notches 1410, and lower housing portion 110-A2 includes alignment protrusions 1420 arranged along side edges 117-A21 and 117-A22 that facilitate assembly. In particular, when PCBA 120-2 is mounted onto lower housing portion 110-A2, alignment notches 1410 are mounted over corresponding alignment protrusions 1420 to precisely align and secure PCB 130-2 during the second molding process.

According to an embodiment of the present invention, lower housing portion 110-A2 includes an open end defined along a front edge 111-A2. That is, lower wall 115-2, side edges 117-A21 and 117-A22 and end rail 114-A2 define a pocket P for receiving PCB 130-2 of PCBA 120-2 such that connector 150-2 extends over front edge 111-A2. Upper housing portion 110-B2 is molded over the side and back edges of lower housing portion 110-A2 in the manner described above, but is also molded onto an upper section 152-2 of connector 150-2, thus securing connector 150-2 to molded housing 110-2.

According to yet another embodiment, lower housing portion 110-A2 is formed with several depressions/grooves 1430 that define relatively thin sections of the lower wall 115-2, with ribs/thick sections 1435 separating adjacent depressions/grooves 1430. Depressions/grooves 1430 are positioned such that, when PCBA 120-2 is mounted onto lower housing portion 110-A2 before the second molding process, each depression/groove 1430 receives a corresponding IC structure 140-2, which further facilitates alignment and minimizes the overall height of the PC card 100-2. Further, ribs/thick sections 1435, which separate adjacent depressions/grooves 1430, provide structural rigidity and/or strength that increase the durability of the assembled PC card.

In addition to alternative memory devices mentioned herein, other alternative embodiments are also possible. For example, although the described embodiments include three parallel-arranged memory devices per mold apparatus, any number of memory devices and/or any arrangement may be utilized without detracting from the spirit of the present invention. In addition, although the described embodiments include an IC and a plug connector mounted on a PCB, in another embodiment the PCBA may include two or more parts (e.g., a first rigid substrate supporting the plug connector, and a second rigid substrate supporting the flash memory device and/or other electronic device, which the two substrate connected, for example, by a flexible cable).

The invention claimed is:

1. A method for manufacturing a memory device incorporating a printed circuit board assembly (PCBA) including a substrate, a metal plug connector mounted on a front edge of the substrate and one or more IC components mounted adjacent to a back edge of the substrate, and wherein the substrate includes a peripheral edge defined by the front and back edges, and by longitudinal side edges extending between the front and back edges, the method comprising:

molding a lower housing portion;

mounting the PCBA onto the lower housing portion such that a peripheral edge of the lower housing portion is exposed around the peripheral edge of the substrate; and molding an upper housing portion by disposing molten thermoplastic material over the PCBA and the lower housing portion such that said molten thermoplastic material forming a peripheral edge of the upper housing portion fuses with the peripheral edge of the lower housing portion, and such that the plug connector protrudes from a front wall of a housing formed by the upper and lower housing portions.

2. The method according to claim 1, wherein molding the lower housing portion comprises injecting thermoplastic material into a first molding apparatus, and wherein the method further comprises removing the lower housing portion from the first molding apparatus and inserting the lower housing portion into a second molding apparatus before mounting the PCBA.

3. The method according to claim 2, wherein the first molding apparatus comprises a cavity network including a plurality of cavity sections, each cavity section communicating with an adjacent cavity section by way of an associated branch channels such that molding the lower housing portion comprises forming a plastic strip including a plurality of linked lower housing portions, each of the linked lower housing portions being connected to an adjacent linked lower housing portion by a plastic tether formed in an associated branch channel during injection of the thermoplastic material.

4. The method according to claim 3, wherein the second molding apparatus comprises a second cavity network including a plurality of second cavity sections, each second cavity section communicating with an adjacent second cavity section by way of an associated second branch channel, and wherein inserting the plastic strip into the second molding apparatus comprises inserting each of the plurality of linked lower housing portions into a corresponding second cavity section, and inserting each of the plastic tethers into an associated second branch channel.

5. The method according to claim 4, wherein molding the upper housing portion further comprises injecting said molten thermoplastic material into the second cavity network such that an upper housing portion is formed on each of the plurality of linked lower housing portions, thereby forming a device strip including a plurality of said memory devices connected by associated tether structures.

6. The method according to claim 5,
wherein each cavity section of the second molding apparatus includes a plug receptacle region, and
wherein mounting the PCBA onto the lower housing portion comprises mounting an associated said PCBA onto each of the linked lower housing portions, and clamping each of said plug connectors in an associated plug receptacle region such that said thermoplastic material injected into the second cavity network is prevented from entering the plug connectors.

7. The method according to claim 5, wherein each cavity section of the second molding apparatus is formed such that front edge portions, side edges and a back edge of each lower housing portion are exposed around the peripheral edge of each associated PCBA, whereby forming the upper housing portion comprises injecting said thermoplastic material over an upper surface of the associated PCBA and onto said exposed front edge portions, side edges and back edge of each lower housing portion.

8. The method according to claim 5, further comprising singulating the device strip by removing the tether structures, thereby providing a plurality of individual memory devices.

9. The method according to claim 2, wherein the first molding apparatus comprises a plurality of cavities such that molding the lower housing portion comprises simultaneously forming a plurality of individual lower housing portions, wherein one of the plurality of lower housing portions is produced in each of the plurality of cavities.

10. The method according to claim 9, wherein the second molding apparatus comprises a plurality of second cavities, and wherein inserting the lower housing portion into the second molding apparatus comprises inserting each of the plurality of lower housing portions into a corresponding second cavity.

11. The method according to claim 10, wherein molding the upper housing portion further comprises injecting said molten thermoplastic material into the plurality of second cavities such that an upper housing portion is formed on each of the plurality of lower housing portions, thereby forming a plurality of said memory devices.

12. The method according to claim 11, wherein each of the plurality of second cavities of the second molding apparatus includes a plug receptacle region, and wherein mounting the PCBA onto the lower housing portion comprises mounting an associated said PCBA onto each of the lower housing portions, and clamping each of said plug connectors in an associated plug receptacle region such that said thermoplastic material injected into the second cavities is prevented from entering the plug connectors.

13. The method according to claim 11, wherein each cavity section of the second molding apparatus is formed such that front edge portions, side edges and a back edge of each lower housing portion are exposed around the peripheral edge of each associated PCBA, whereby forming the upper housing portion comprises injecting said thermoplastic material over an upper surface of the associated PCBA and onto said exposed front edge portions, side edges and back edge of each lower housing portion.

14. The method according to claim 2, wherein at least one of the first molding apparatus and the second molding apparatus includes a pin-like structure that is positioned to produce a through-hole in at least one of the upper housing portion and the lower housing portion, and wherein the method further comprises providing a light emitting diode (LED) structure on said PCBA such that the LED structure is exposed through said through-hole.

15. The method according to claim 1, further comprising fabricating the substrate, and soldering the IC components and the metal plug connector to the substrate.

16. The method according to claim 1, wherein the plug connector is a Universal Serial Bus (USE) plug connector.

17. The method according to claim 1, wherein the memory device is an Express Card-type memory device.

18. The method according to claim 1,
wherein the substrate of the PCBA defines alignment notches,
wherein molding the lower housing portion comprises forming alignment protrusions along the inside edge of the lower housing portion, and
mounting the PCBA onto the lower housing portion comprises mounting the alignment notches over the alignment protrusions such that the alignment notches secure the PCBA relative to the lower housing portion when the upper housing portion is molded onto the lower housing portion.

19. The method according to claim 1, wherein the substrate of the PCBA includes at least one lower IC device mounted on a lower surface of the substrate,
wherein molding the lower housing portion comprises forming a lower wall defining at least one depression, and
mounting the PCBA onto the lower housing portion comprises mounting the lower IC device into the depression formed in the lower housing portion.

* * * * *